United States Patent
Dijkmans et al.

(10) Patent No.: US 7,787,847 B2
(45) Date of Patent: Aug. 31, 2010

(54) FRONT END AND HIGH FREQUENCY RECEIVER HAVING QUADRATURE LOW NOISE AMPLIFIER

(75) Inventors: Eise Carel Dijkmans, Eindhoven (NL); Dominicus Martinus Wilhelmus Leenaerts, Eindhoven (NL); Petrus Gerardus Maria Baltus, Eindhoven (NL)

(73) Assignee: ST-Ericsson SA, Geneva (CH)

( * ) Notice: Subject to any disclaimer, the term of this patent is extended or adjusted under 35 U.S.C. 154(b) by 1118 days.

(21) Appl. No.: 10/055,388

(22) Filed: Jan. 23, 2002

(65) Prior Publication Data

US 2002/0098820 A1 Jul. 25, 2002

(30) Foreign Application Priority Data

Jan. 24, 2001 (EP) .................................. 01200238

(51) Int. Cl.
*H04B 1/06* (2006.01)

(52) U.S. Cl. ............... 455/232.1; 455/234.1; 455/250.1

(58) Field of Classification Search ............. 455/253.2, 455/303, 304, 305, 314, 315, 317, 311, 302, 455/309, 312, 324, 75, 341, 334, 333, 263, 455/232.1, 234.1, 214, 233.1; 375/316
See application file for complete search history.

(56) References Cited

U.S. PATENT DOCUMENTS

| | | | | |
|---|---|---|---|---|
| 2,730,699 A | * | 1/1956 | Gratian | ........................ 455/313 |
| 4,420,130 A | | 12/1983 | Regipa | |
| 5,140,703 A | | 8/1992 | Payne | |
| 5,507,036 A | * | 4/1996 | Vagher | ........................ 455/214 |
| 5,546,048 A | * | 8/1996 | Sano et al. | ................... 330/263 |
| 6,195,400 B1 | * | 2/2001 | Maeda | ..................... 455/233.1 |
| 6,317,589 B1 | * | 11/2001 | Nash | ........................... 455/214 |
| 6,324,388 B1 | * | 11/2001 | Souetinov | .................... 455/302 |
| 6,509,799 B1 | * | 1/2003 | Franca-Neto | ............... 330/305 |
| 6,535,720 B1 | * | 3/2003 | Kintis et al. | ............. 455/115.1 |
| 6,546,237 B1 | * | 4/2003 | Glas | ............................. 455/324 |
| 6,816,718 B2 | * | 11/2004 | Yan et al. | ..................... 455/317 |
| 6,904,538 B2 | * | 6/2005 | Glas et al. | .................... 713/324 |
| 2002/0039039 A1 | * | 4/2002 | Maligeorgos | ............... 327/116 |
| 2002/0063657 A1 | * | 5/2002 | Shuch | ......................... 342/362 |
| 2002/0141511 A1 | * | 10/2002 | Vishakhadatta et al. | ..... 375/316 |
| 2004/0057534 A1 | * | 3/2004 | Masenten et al. | ........... 375/316 |

FOREIGN PATENT DOCUMENTS

| | | | |
|---|---|---|---|
| EP | 1 035 691 A2 | | 9/2000 |
| FR | 2488093 | * | 2/1982 |
| JP | 57073974 | * | 8/1982 |
| JP | 10-65442 | | 3/1998 |
| JP | 2000-295305 | | 10/2000 |
| JP | 2002-217769 | | 8/2002 |

OTHER PUBLICATIONS

International Search Report dated May 22, 2002 in connection with PCT Application No. PCT/IB01/002683.

* cited by examiner

*Primary Examiner*—Lana N Le

(57) ABSTRACT

A front end and a high frequency receiver provided therewith are described, which front end comprises a quadrature low noise amplifier as a low noise amplifier. A high isolation between local oscillators and quadrature mixers is achieved thereby, reducing a DC offset at mixer outputs. The quadrature low noise amplifier may be implemented as a differential class AB cascode arrangement of MOST or FET semiconductors. A low distortion receiver having a high linearity is the result.

13 Claims, 2 Drawing Sheets

FRONT END AND HIGH FREQUENCY RECEIVER HAVING QUADRATURE LOW NOISE AMPLIFIER

The present invention relates to a front end for a high frequency receiver, which front end comprises a low noise amplifier.

The present invention also relates to a high frequency receiver, which is provided with such a front end comprising a low noise amplifier, and which is provided with quadrature mixers coupled to the low noise amplifier, and relates to a quadrature low noise amplifier for application in the high frequency receiver.

The present invention also relates to a communication device, for example a radio receiver, transceiver or a telephone, such as a mobile or cordless telephone provided with such a high frequency receiver.

Such a receiver is known from the article 'A 1.9-GHz Wide-Band IF Double Conversion CMOS Receiver for Cordless Telephone Applications', By J. C. Rudell et al, IEEE Journal of Solid-State Cicuits, vol. 32, No. 12, December 1997, pages 2071-2088. Several possible receiver architectures are disclosed in the article, wherein the high radio frequency (RF) front end of the receiver successively comprises an antenna, an RF filter, a low noise amplifier followed by intermediate frequency (IF) and mixer stages. One or more local oscillators (LO) are used for mixing an RF signal to the IF frequency, which may also be a near zero, or zero frequency signal. The problem of local oscillator signal leakage to mixer inputs, moderate LO isolation and self-mixing is known to result in unwanted even varying DC offsets at outputs of the various mixers. The DC offsets in turn give rise to reduction of the dynamic range of the receiver requiring additional technical measures, which are difficult to integrate on a limited chip area, increase costs, as well as power consumption.

Therefore it is an object of the present invention to provide an RF front end and RF receiver, which may be integrated fully on a limited chip area against reduced costs, and which gives rise to reduced DC offsets.

Thereto the front end and high frequency receiver according to the invention are characterised in that the low noise amplifier (LNA) circuit is a quadrature LNA circuit.

It is an advantage of the front end and HF receiver according to the present invention that the inventor has realised that by introducing a quadrature LNA circuit in front of the quadrature mixers, inputs of the mixers are being isolated by the quadrature LNAs. As a consequence leakage of the quadrature local oscillator signals to the mixer inputs is effectively prevented, which reduces DC offsets at outputs of the mixers. In addition this reduction increases the dynamic range of the high frequency receiver according to the invention. Furthermore it has been found that the quadrature LNAs may even for certain applications have a moderate amplification factor around one, or lower, such that simple quadrature impedance transformers result. This reduces the power consumption of these LNA transformers and decreases their occupied IC chip area.

An embodiment of the high frequency receiver according to the invention is characterised in that quadrature paths of the quadrature low noise amplifier are implemented differentially. This advantageously results in reduced second order distortion effects. In addition sensitivity towards substrate bouncing is decreased, which means that again signal distortion is kept to a minimum.

A further embodiment of the high frequency receiver according to the invention is characterised in that the differential quadrature low noise amplifier is constructed as a class AB operating circuit.

Such an embodiment has a high linearity, which reduces intermodulation distortion, but is also capable of providing sufficient output current for driving further circuitry which is coupled to such a class AB operating circuit.

A still further embodiment, which is easy to implement and has a reduced number of components to realise the high frequency receiver according to the invention is characterised in that the quadrature low noise amplifier comprises a cascode arrangement of semiconductors.

Suitable preferred semiconductors are of the type MOST, such as NMOST or PMOST, or FET, such as MESFET, or the like.

Another embodiment of the high frequency receiver according to the invention is characterised in that across the cascode arrangement of semiconductors there is connected a capacitor.

Advantageously this capacitor acts as a local battery for the cascode arrangement of semiconductors, and also serves to decrease third harmonic distortion by approximately 10 dB.

An embodiment of the high frequency receiver according to the invention, which is preferred because it improves linearity by cancelling gain mismatch between the quadrature LNAs, is characterised in that the high frequency receiver comprises two quadrature choppers coupled between respective outputs of the quadrature low noise amplifiers and respective inputs of the quadrature mixers.

If in still another embodiment of the high frequency receiver according to the invention the receiver is characterised in that the quadrature choppers and quadrature mixers are combined to passive quadrature choppers/mixers, then a still further decrease of power consumption can be realised, which is also very important in relation to developments towards a one chip receiver.

Similar advantages and favourable results can be mentioned for a communication device, for example a radio receiver, transceiver or a telephone, such as a mobile or cordless telephone provided with such a high frequency receiver.

At present the high frequency receiver according to the invention will be elucidated further together with its additional advantages while reference is being made to the appended drawing, wherein similar components are being referred to by means of the same reference numerals. In the drawing.

Figure 1:
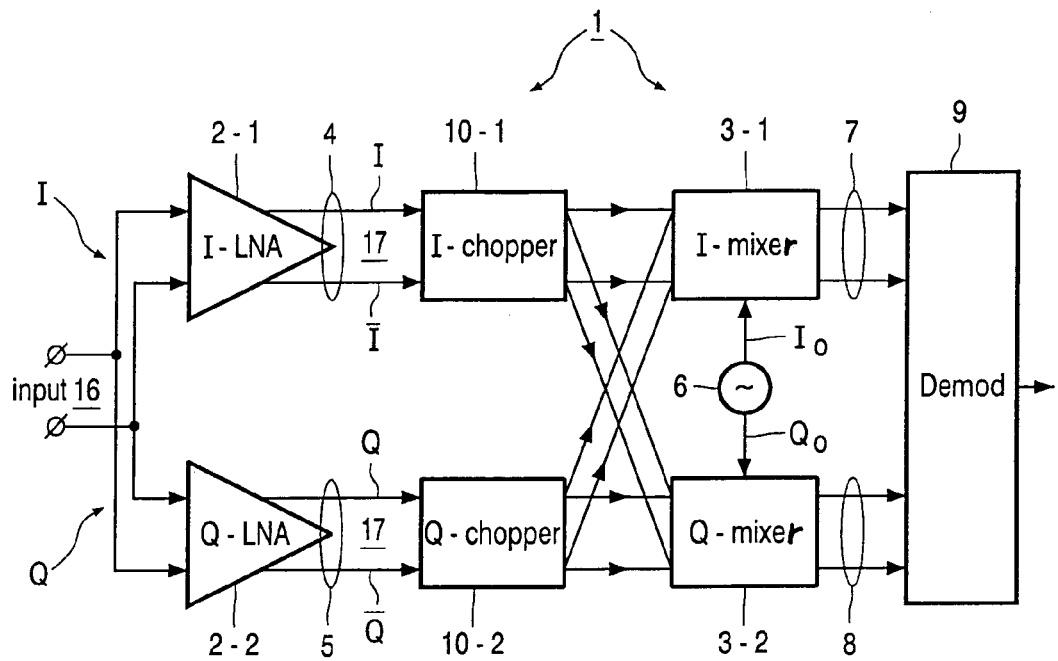
FIG. 1 shows a simplified block diagram of a high frequency receiver according to the present invention.

FIG. 1 shows a block diagram of a high frequency receiver 1, in particular its so called front end. In the front end such a receiver 1 comprises an low noise amplifier 2 in the form of quadrature low noise amplifiers 2-1 and 2-2, hereafter LNAs 2, which are coupled through a terminal indicated 'input', and usually a band-pass filter and/or antenna switch (both not shown) to an antenna (also not shown). The receiver 1 also comprises an I-mixer 3-1 and a Q-mixer 3-2, which may in one embodiment be coupled directly to outputs 4 and 5 of the I and Q LNAs 2-1 and 2-2 respectively. The quadrature mixers 3 are coupled to quadrature outputs $I_O$ and $Q_O$ of generally one local oscillator 6, and mixer IF outputs 7 and 8 are coupled to a quadrature demodulator (Demod) 9, which may for example include a sigma-delta demodulator or any other suitable demodulator. Such a receiver scheme having an I and a Q path as indicated can be used in for example a—possibly multistage—IF receiver, such as a zero IF, near zero IF receiver or the like. In particular in a communication device such as a radio receiver, transceiver or a telephone, for example a mobile or cordless telephone provided with such a high frequency receiver 1. By including the quadrature LNAs 2 in the receiver 1 the local oscillator output signals $I_O$ and $Q_O$ from the oscillator 6 are prevented from cross mixing or self mixing, such that DC offsets occur at differential mixer outputs 7 and 8. This leads to a receiver 1 having an improved dynamic range.

Figure 2:
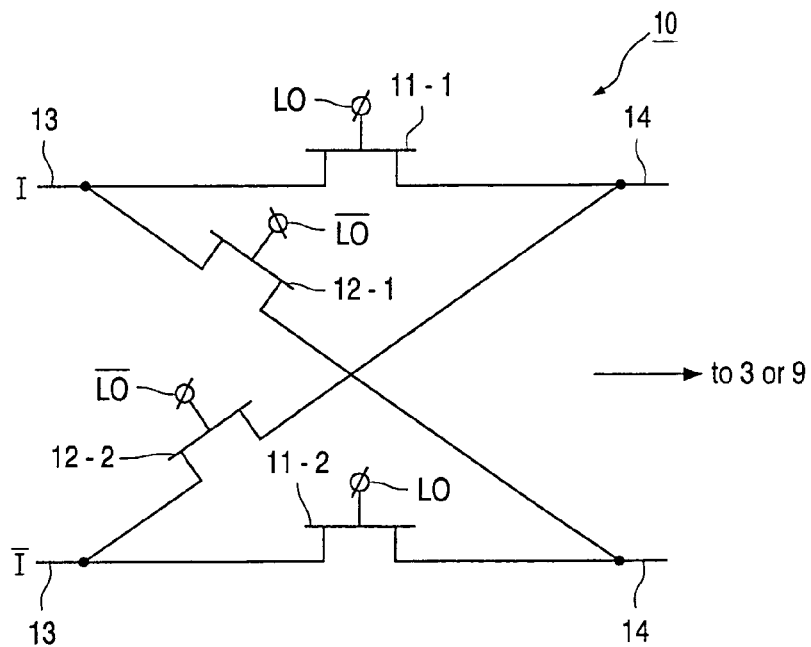
FIG. 2 shows a possible embodiment of a passive quadrature chopper for application in the high frequency receiver of FIG. 1.

The receiver 1 may in a further embodiment comprise quadrature choppers 10-1 and 10-2. FIG. 2 shows an embodiment of a possibly passive quadrature chopper 10 for application in the high frequency receiver 1. The chopper 10 switches I and Q signals in quadrature paths I and Q of the receiver 1 to improve linearity by cancelling a possible gain mismatch between the LNAs 2-1 and 2-2. The embodiment of the chopper 10 is preferred in that it is a combined chopper mixer structure, which in addition is passive, as a result of which it shows a reduced power consumption. The passive chopper mixer 10 has a structure which is easy to implement on a chip with only a very moderate chip area. It consists of parallel coupled semiconductors 11-1, 11-2 and cross coupled semiconductors 12-1, 12-2 connecting differential inputs 13 and 14. The semiconductors 11 and 12 if properly controlled and timed on their respective gates by local oscillator signals LO or their inverse LO with upper score, achieve a simultaneous mixing and chopper action by the same kind of passive low power consuming structure.

Figure 3:
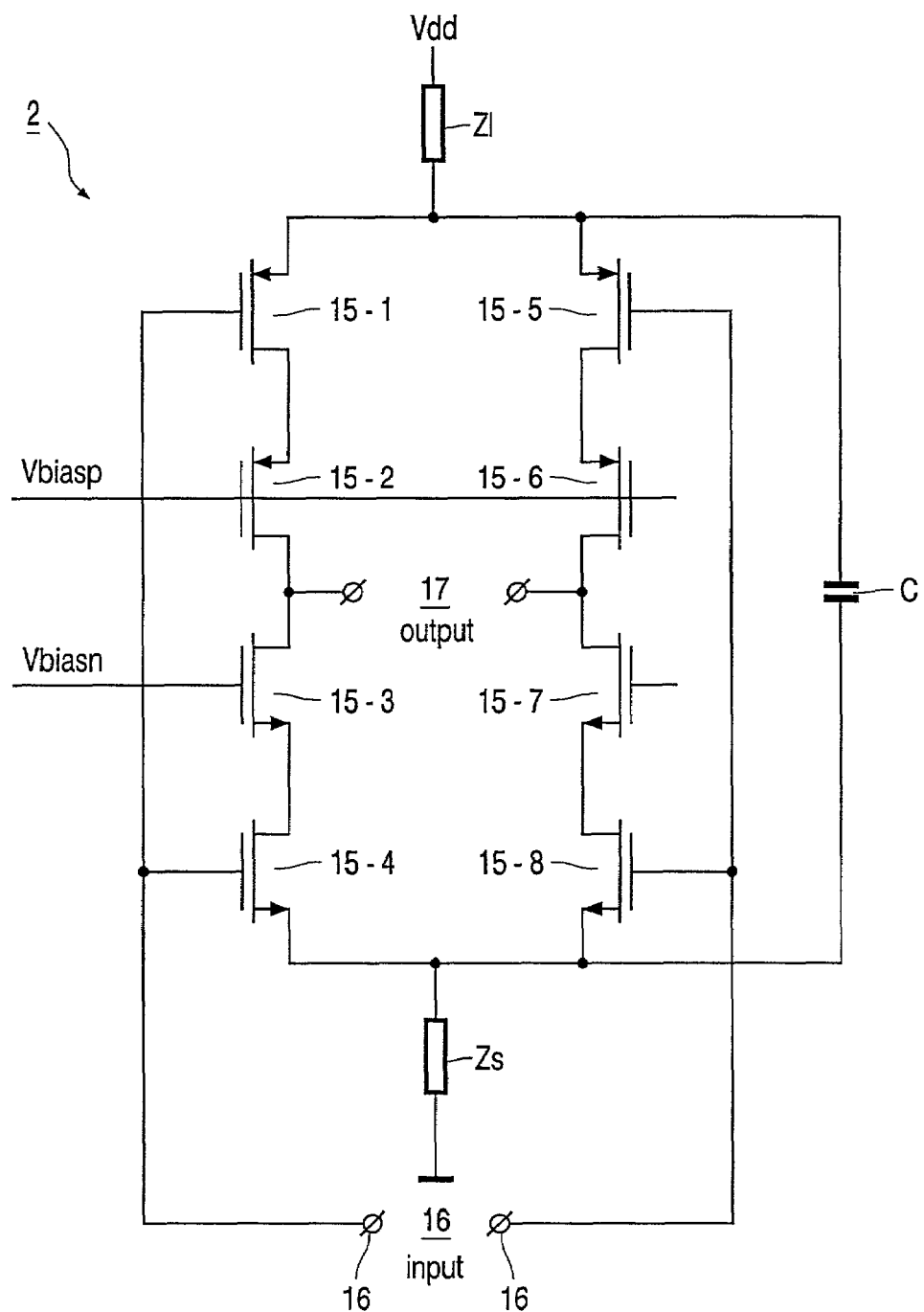
FIG. 3 shows a passive embodiment of a differential cascode arrangement of semiconductors implementing the one of the quadrature low noise amplifiers.

A from a viewpoint of high linearity and high isolation preferred embodiment of an I or Q LNA 2 is shown in FIG. 3. It shows a passive low power consuming differential cascode arrangement of semiconductors 15-1 . . . 15-8 implementing such a quadrature low noise amplifier. Input 16, which is a differential input in this case is coupled to two branches, each having four semiconductors 15. Also output 17, which corresponds to earlier inputs 4 and 5, is a differential output in this case and this output 17 is isolated from the input controlled semiconductors 15-1, 15-4, 15-5, 15-8 by isolating semiconductors 15-2, 15-3, 15-6, 15-7 respectively. This results in a high isolation value between input 16 and output 17, , which is now very well isolated from the input 16, in order to reduce self mixing by the local oscillator signal that may be present at the output 17, which is coupled to the mixer 3 or the chopper 10.

The LNA 2 of FIG. 3, apart from circuit impedances Z1 and Zs coupled to supply voltage Vdd and earth respectively, further has a capacitor C coupled as shown across the cascoded semiconductors 15. This capacitor C acts as a battery or voltage source to the cascode arrangement, reduces third order distortion of the LNA and provides an improved linearity to the arrangement. The arrangement of semiconductors 15 is a class AB circuit, so that an effective output current may be provided by the differential output 17 to further circuitry coupled therewith. Generally the semiconductors 15 are of the type MOST, such as a NMOST or a PMOST, or of the type FET, such as a MESFET, or the like.

Whilst the above has been described with reference to essentially preferred embodiments and best possible modes it will be understood that these embodiments are by no means to be construed as limiting examples of the devices concerned, because various modifications, features and combination of features falling within the scope of the appended claims are now within reach of the skilled person.

The invention claimed is:

1. A high frequency receiver which is provided with a front end comprising:
    a first quadrature low noise amplifier;
    a second quadrature low noise amplifier;
    first and second quadrature mixers coupled to respective ones of the first and second low noise amplifiers;
    first and second quadrature choppers respectively coupled between respective outputs of the respective ones of the first and second quadrature low noise amplifiers, and respective inputs of respective ones of the first and second mixers, the outputs of the first and second mixers being demodulated by a quadrature demodulator, said choppers respectively switching in-phase and quadrature signals.

2. A high frequency receiver according to claim 1, wherein quadrature paths of the first and second quadrature low noise amplifiers are implemented differentially.

3. The high frequency receiver according to claim 2, wherein the differential first and second quadrature low amplifiers are constructed as a class AB operating circuits.

4. The high frequency receiver according to claim 2, wherein each of said first and second quadrature low noise amplifiers comprises a cascode arrangement of semiconductors.

5. The high frequency receiver according to claim 4, wherein each of said first and second semiconductors are of the type MOST.

6. A high frequency receiver according to claim 4, wherein across the cascode arrangement of semiconductors there is connected a capacitor (C).

7. The receiver according to claim 6, wherein said cascode arrangement comprises two parallel legs of said semiconductors, both legs being in parallel with said capacitor.

8. The receiver according to claim 6, wherein said cascode arrangement comprises a differential cascode arrangement.

9. The high frequency receiver according to claim 1, wherein the quadrature choppers and quadrature mixers are combined to passive quadrature choppers/mixers.

10. The receiver according to claim 1, wherein the first and second quadrature mixers are in a receive circuit of said receiver.

11. The receiver according to claim 10, wherein output of said first and second mixers comprises a signal that has been down-converted by said receive circuit.

12. The receiver according to claim 1, wherein each of said choppers switches its respective outputs for coupling with the outputs of the other of said choppers.

13. A high frequency receiver which is provided with a front end comprising:
    a first quadrature low noise amplifier;
    a second quadrature low noise amplifier;
    first and second quadrature mixers coupled to respective ones of the first and second low noise amplifiers;
    first and second quadrature choppers respectively coupled between respective outputs of the respective ones of the first and second quadrature low noise amplifier, and respective inputs of respective ones of the first and second quadrature mixers, the outputs of the first and second mixers being demodulated by a quadrature demodulator, wherein each of said choppers switches its respective outputs for coupling with the outputs of the other of said choppers.

* * * * *